United States Patent
Hayk et al.

(10) Patent No.: US 9,941,311 B2
(45) Date of Patent: Apr. 10, 2018

(54) FLEXIBLE DISPLAY DEVICE AND MANUFACTURING METHOD THEREOF

(71) Applicant: Samsung Display Co., Ltd., Yongin-si, Gyeonggi-do (KR)

(72) Inventors: Khachatryan Hayk, Hwaseong-si (KR); Ki Hyun Kim, Daegu (KR); Sun Ho Kim, Seongnam-si (KR); Jeong Ho Kim, Seoul (KR); Tae Woong Kim, Seongnam-si (KR); Yeon Gon Mo, Yongin-si (KR); Dan Bi Choi, Hwaseong-si (KR)

(73) Assignee: Samsung Display Co., Ltd., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/271,022

(22) Filed: Sep. 20, 2016

(65) Prior Publication Data
US 2017/0125453 A1 May 4, 2017

(30) Foreign Application Priority Data
Oct. 29, 2015 (KR) .......................... 10-2015-0151084

(51) Int. Cl.
*H01L 27/12* (2006.01)
*H01L 21/683* (2006.01)
(Continued)

(52) U.S. Cl.
CPC ...... *H01L 27/1262* (2013.01); *H01L 21/6835* (2013.01); *H01L 27/1266* (2013.01);
(Continued)

(58) Field of Classification Search
CPC ............. H01L 27/1262; H01L 51/0097; H01L 21/6835; H01L 27/3244; H01L 51/5253;
(Continued)

(56) References Cited

U.S. PATENT DOCUMENTS 5,232,860 A 8/1993 Kawanishi et al.
5,665,802 A 9/1997 Maki et al.
(Continued)

FOREIGN PATENT DOCUMENTS

KR 10-2011-0124113 A 11/2011
KR 10-2013-0010146 A 1/2013
(Continued)

OTHER PUBLICATIONS

Allen, Kimberly J. "Reel to Real: Prospects for Flexible Displays." Proceedings of the IEEE, vol. 93, No. 8, Aug. 2005, pp. 1394-1399.
(Continued)

*Primary Examiner* — Cuong B Nguyen
(74) *Attorney, Agent, or Firm* — Knobbe, Martens, Olson & Bear, LLP

(57) ABSTRACT

Disclosed herein is a flexible display device, including: a substrate that comprises a first surface and a second surface which is an opposite surface to the first surface; a light-emitting device disposed on the first surface; a reduction layer disposed on the second surface; and a barrier layer disposed between the second surface and the reduction layer.

10 Claims, 10 Drawing Sheets

(51) Int. Cl.
*H01L 27/32* (2006.01)
*H01L 51/00* (2006.01)
*H01L 51/52* (2006.01)

(52) U.S. Cl.
CPC ...... *H01L 27/3244* (2013.01); *H01L 51/0097* (2013.01); *H01L 51/5253* (2013.01); *H01L 27/1225* (2013.01); *H01L 2221/68318* (2013.01); *H01L 2221/68345* (2013.01); *H01L 2221/68377* (2013.01); *H01L 2221/68381* (2013.01); *H01L 2227/326* (2013.01); *H01L 2251/5338* (2013.01)

(58) Field of Classification Search
CPC ................. H01L 2221/68381; H01L 2221/68318–2221/68372; H01L 2221/68345; H01L 2221/68377; H01L 2227/326; H01L 21/76254–21/76259; H01L 2224/96–2224/98; H01L 2924/35121
See application file for complete search history.

(56) References Cited

U.S. PATENT DOCUMENTS

| | | | |
|---|---|---|---|
| 6,071,795 A | 6/2000 | Cheung et al. | |
| 7,842,547 B2 | 11/2010 | Shelton et al. | |
| 2015/0021562 A1* | 1/2015 | Kim | H01L 51/5253 257/40 |
| 2015/0187984 A1* | 7/2015 | Yamashita | G02F 1/133305 438/23 |

FOREIGN PATENT DOCUMENTS

| | | |
|---|---|---|
| KR | 10-2015-0002959 A | 1/2015 |
| KR | 10-2015-0051488 A | 5/2015 |

OTHER PUBLICATIONS

Crawford, Gregory P. "Flexible Flat Panel Displays." John Wiley & Sons, Ltd. 2005, p. 526.

Georgiev et al. "Preparation of Polyimide Thin Films by Vapour Deposition and Solid State Reactions." Polymer Thin Films, Abbass A Hashim (Ed.) 2010. ISBN: 978-953-307-059-9, InTech, Available from: http://www.intechopen.com/books/polymer-thin-films/preparationof-polyimide-thin-films-by-vapour-deposition-and-solid-state-reactions.

Haq et al. "Temporary Bond-Debond Technology for High-Performance Transistors on Flexible Substrates." Journal of the SID, vol. 18, No. 11, 2010, pp. 884-891.

Kim et al. "Flexible Organic Light-Emitting Diodes using a Laser Lift-off Method." J. Mater. Chem. C, 2014, 2, pp. 2144-2149.

Ressler et al. "Formation of Bronzes During Temperature-programmed Reduction of $MoO_3$ with Hydrogen—An In situ XRD and XAFS Study." Solid State Ionics. 141-142, 2001, 243-252.

Ressler et al. "In Situ XAS and XRD Studies on the Formation of Mo Suboxides during Reduction of $MoO_3$." J. Phys. Chem. B. 200, 104, pp. 6360-6370.

Takechi et al. "Very High Rate and Uniform Glass Etching with HF/HCl Spray for Transferring Thin-Film Transistor Arrays to Flexible Substrates." JPn. J. Appl. Phys., vol. 45, No. 7, 2006, pp. 6008-6010.

* cited by examiner

FLEXIBLE DISPLAY DEVICE AND MANUFACTURING METHOD THEREOF

RELATED APPLICATIONS

This application claims priority to and the benefit of Korean Patent Application No. 10-2015-0151084 filed in the Korean Intellectual Property Office on Oct. 29, 2015, the entire contents of which are incorporated herein by reference.

BACKGROUND

Field

The described technology relates generally to a flexible display device and a manufacturing method thereof.

Description of the Related Art

Display devices include liquid crystal displays (LCD), plasma display panels (PDP), organic light emitting diode (OLED) displays, field emission displays (FED), electrophoretic displays, and the like. Recently, a technique in which such various display devices are formed with a flexible material has been studied. Since the display device formed with the flexible material may be applied to a new item such as an electronic book and an electronic paper, the display device may be widely used in various fields.

Such a flexible display device is manufactured by forming a substrate including a resin such as a polyimide and the like on a support substrate, forming a light-emitting element on the substrate, and then separating the substrate from the support substrate. In such a manufacturing process, a method of separating the substrate from the support substrate while preventing damage to the light-emitting element formed on the substrate would be beneficial.

The above information disclosed in this Background section is only to enhance the understanding of the background of the described technology and therefore it may contain information that does not form the prior art that is already known in this country to a person of ordinary skill in the art.

SUMMARY

The described technology has been made in an effort to provide a flexible display device and a manufacturing method thereof that can easily perform delamination from a support substrate.

An example embodiment provides a flexible display device, including: a substrate that comprises a first surface and a second surface which is an opposite surface to the first surface; a light-emitting device disposed on the first surface; a reduction layer disposed on the second surface; and a barrier layer disposed between the second surface and the reduction layer.

The reduction layer may include a metal or a metal oxide.

The reduction layer may include at least one of a molybdenum dioxide ($MoO_2$), a manganese oxide (MnO), and manganese (Mn).

The barrier layer may contain hydrogen.

The barrier layer may include at least one of silicon (Si), a silicon oxide (SiOx), a silicon nitride (SiNx), and a silicon oxynitride (SiON).

The substrate has a smaller coefficient of thermal expansion (CTE) than the reduction layer.

Another embodiment provides a manufacturing method of a flexible display device, including: forming a release layer on a support substrate; forming a barrier layer on the release layer; forming a substrate and a light-emitting device on the barrier layer; forming a reduction layer by reducing some of the release layer adjacent to the barrier layer by a heat treatment; and separating the substrate from the support substrate by separating an interface between the release layer and the reduction layer.

The heat treatment may be performed at from about 400° C. to about 500° C. for about 0.5 to 4 h.

The reduction layer may have a smaller coefficient of thermal expansion (CTE) than the release layer.

The release layer may have a thickness of about 500 Å to 2000 Å.

The release layer may include a metal oxide.

The release layer may include at least one of molybdenum trioxide (MoO3) and manganese dioxide (MnO2).

The forming of the release layer may include depositing molybdenum (Mo) or manganese (Mn) by sputtering and then performing heat treatment on the deposited molybdenum (Mo) or manganese (Mn) in an air atmosphere containing oxygen.

The barrier layer may contain hydrogen.

Some of the release layer may be reduced by the hydrogen contained in the barrier layer.

The forming of the barrier layer may include depositing at least one of silicon (Si), a silicon oxide (SiOx), a silicon nitride (SiNx), and a silicon oxynitride (SiON) while supplying hydrogen gas as one of reaction gasses.

According to embodiments, it is possible to prevent a light-emitting device and a thin film transistor portion from being damaged by easily delaminating a substrate from a support substrate without other processes or an additional external force in addition to a heat treatment process, and it is possible to provide a manufacturing method of a flexible display device having a simplified processes compared to a conventional art.

DETAILED DESCRIPTION

Figure 1:
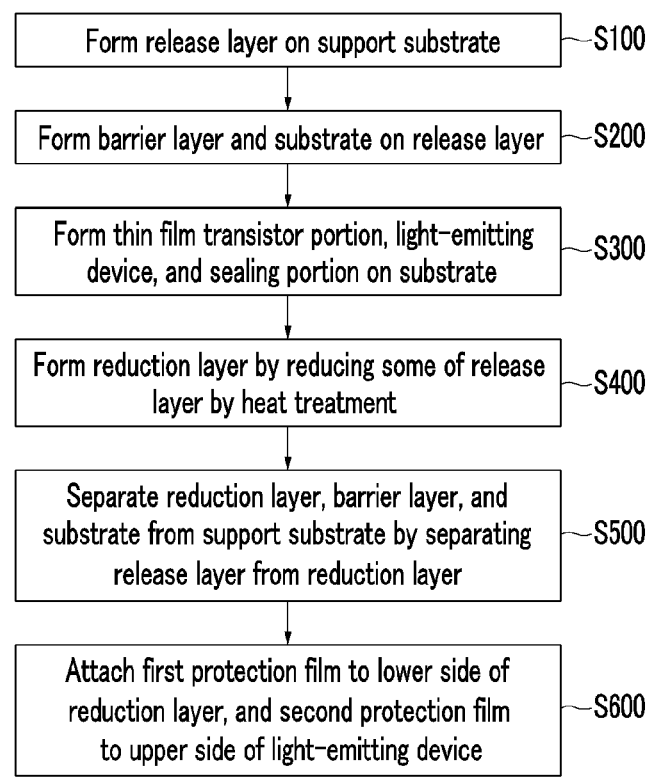
FIG. 1 illustrates a flowchart of a manufacturing method of a flexible display device according to an example embodiment.
Figure 2:
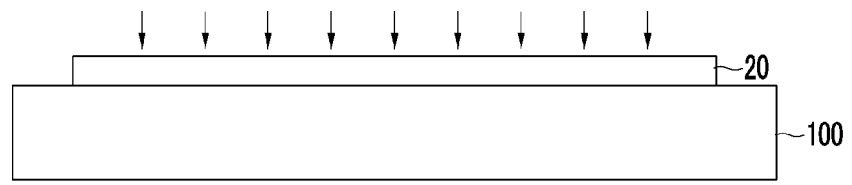
FIGS. 2 to 8 illustrate cross-sectional views of a manufacturing method of an organic light emitting device according to an example embodiment.
Figure 3:
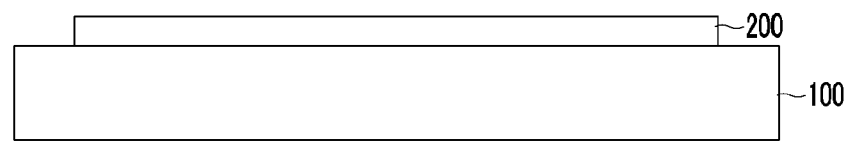

The present embodiments will be described more fully hereinafter with reference to the accompanying drawings, in which example embodiments are shown. As those skilled in the art would realize, the described embodiments may be modified in various different ways, all without departing from the spirit or scope of the present embodiments.

Parts that are irrelevant to the description will be omitted in order to clearly describe the present embodiments, and the same or similar constituent elements will be designated by the same reference numerals throughout the specification.

Further, in example embodiments, for components having the same configuration, like reference numerals are used and described only in one illustrative embodiment, and in other embodiments, only different configurations from the illustrative embodiment will be described.

Further, in the drawings, the size and thickness of each element are arbitrarily illustrated for ease of description, and the present embodiments are not necessarily limited to those illustrated in the drawings.

In the drawings, the thickness of layers, films, panels, regions, etc., are exaggerated for clarity. In the drawings, for ease of description, the thicknesses of some layers and regions are exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. Further, in the specification, the word "on" means positioned above or below the object portion, and does not necessarily mean positioned on the upper side of the object portion based on a gravitational direction.

A manufacturing method of a flexible display device according to an example embodiment will now be described with reference to FIGS. 1 to 8.

FIG. 1 illustrates a flowchart of a manufacturing method of a flexible display device according to an example embodiment. FIGS. 2 to 8 illustrate cross-sectional views of a manufacturing method of an organic light emitting device according to an example embodiment.

First, a release layer 200 is formed on a support substrate 100 (S100).

The release layer 200 is formed on the support substrate 100 made of glass, metal, inorganic material (ceramic). The release layer 200 comprises a metal oxide. Herein, the metal oxide may be molybdenum trioxide ($MoO_3$) or manganese dioxide ($MnO_2$).

The release layer 200 may be formed by after forming a metal layer 20 including molybdenum (Mo) or manganese (Mn) on the support substrate 100 by using a deposition process such as a chemical vapor deposition (CVD) process and a sputtering process, and then performing heat treatment (refer to FIG. 2) on the metal layer 20 in an air atmosphere containing oxygen. In this case, the heat treatment temperature may be from about 350° C. to about 480° C., and preferably from about 400° C. to about 450° C. A thickness of the release layer 200 may be about 500 Å to 2000 Å, and preferably about 1000 Å to about 1500 Å.

Figure 4:
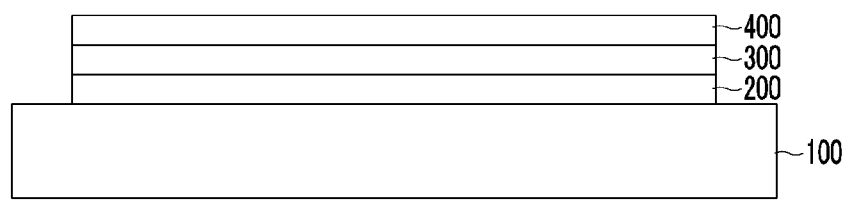

Next, as shown in FIG. 4, a barrier layer 300 and a substrate 400 are sequentially formed on the release layer 200 (S200).

The barrier layer 300 may be formed by depositing at least one of silicon (Si), a silicon oxide (SiOx), a silicon nitride (SiNx), and a silicon oxynitride (SiON) while supplying hydrogen gas as one of reaction gasses, through the chemical vapor deposition (CVD) process. The formed barrier layer 300 comprises hydrogen.

The substrate 400 may be formed as an organic layer or an inorganic layer. For example, the substrate 400 may include a polyimide, a perylene, an aluminum oxide ($Al_2O_3$), or silicon dioxide ($SiO_2$), but is not limited thereto.

Figure 5:
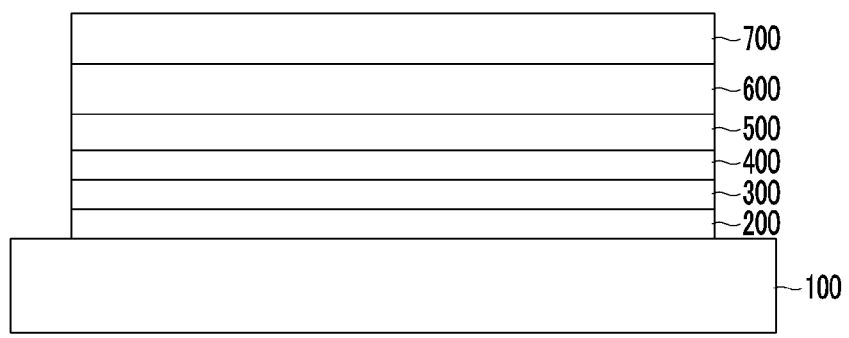

Next, as shown in FIG. 5, a thin film transistor portion 500, a light-emitting device 600, and a sealing portion 700 are formed on the substrate 400 (S300).

For convenience of illustration, the thin film transistor portion 500 is simply shown to be a single layer in FIG. 5, but the thin film transistor portion 500 may include a plurality of wires, a plurality of thin film transistors connected to the plurality of wires, and a plurality of capacitive elements. The thin film transistor portion 500 may be formed to have various known structures. The light-emitting device 600 formed on the thin film transistor portion 500 may include a plurality of organic light emitting elements, but is not limited thereto. The light-emitting device 600 is controlled by the thin film transistor portion 500 to emit light and display an image depending on a predetermined signal. For convenience of illustration, the light-emitting device 600 is simply shown to be a single layer in FIG. 5. Subsequently, the sealing portion 700 is formed on the light-emitting device 600. For convenience of illustration, the sealing portion 700 is simply shown as a single layer stacked on the light-emitting device 600 in FIG. 5, but it may be formed to have a shape such as a thin film encapsulation portion or an encapsulation substrate, and may be formed to have any shape being capable of sealing the light-emitting device 600.

Figure 6:
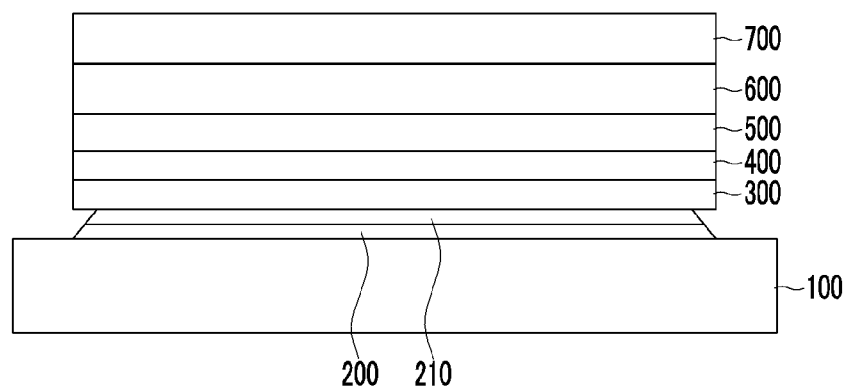

Next, as shown in FIG. 6, a reduction layer 210 is formed by reducing some of the release layer 200 by the heat treatment (S400).

The reduction layer 210 is formed by the hydrogen contained in the barrier layer 300 being moved to the release layer 200 to reduce the metal oxide contained in the release layer 200 by the heat treatment. When the release layer 200 comprises molybdenum trioxide ($MoO_3$), the reduction layer 210 comprises molybdenum dioxide ($MoO_2$). When the release layer 200 comprises manganese dioxide ($MnO_2$), the reduction layer 210 comprises manganese (Mn) or manganese oxide (MnO).

In this case, the heat treatment may be performed at from about 400° C. to about 500° C. for from about 0.5 to about 4 h. Accordingly, the reduction starts from the release layer 200 adjacent to the barrier layer 300, such that some of the release layer 200 is formed as the reduction layer 210 in a thickness direction thereof. The reduction layer 210 have a smaller coefficient of thermal expansion (CTE) than the release layer 200, thereby having a contracted form compared to the release layer 200 as shown in FIG. 6.

Figure 7:
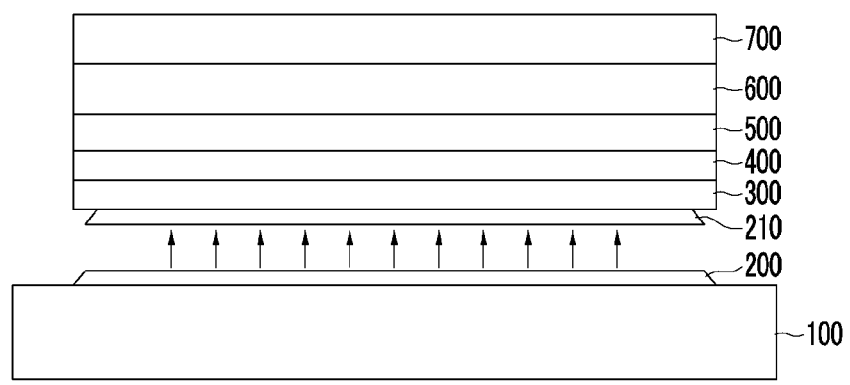

Next, as shown in FIG. 7, the reduction layer 210, the barrier layer 300, and the substrate 400 are separated from the support substrate 100 by separating the release layer 200 from the reduction layer 210 (S500).

The release layer 200 is spontaneously separated from the reduction layer 210 without an additional external force by stress between the release layer 200 and the reduction layer 210. This result may be obtained because the coefficient of thermal expansion (CTE) of the reduction layer 210 is smaller than the coefficient of thermal expansion (CTE) of the release layer 200. Since the reduction layer 210 has a smaller CTE than the release layer 200, a deformation amount thereof due to the heat applied thereto is small, and thus stress occurs at an interface between the reduction layer 210 and the release layer 200 because of a difference between the deformation amounts of the reduction layer 210 and the release layer 200. The release layer 200 may be easily separated from the reduction layer 210 by the occurred stress. This result may be obtained by only the heat treatment for reduction of the release layer 200, but is not limited thereto, and an additional heat treatment and a cooling process may be performed for increase of the stress.

During the process, even if the release layer 200 and the reduction layer 210 are expanded or contracted by the heat treatment, since the substrate 400 having a much smaller CTE than that of the release layer 200 and the reduction layer 210 is formed at a lower portion of the thin film transistor portion 500 and the light-emitting device 600, it is possible to prevent the thin film transistor portion 500 and the light-emitting device 600 from being deformed.

Figure 8:
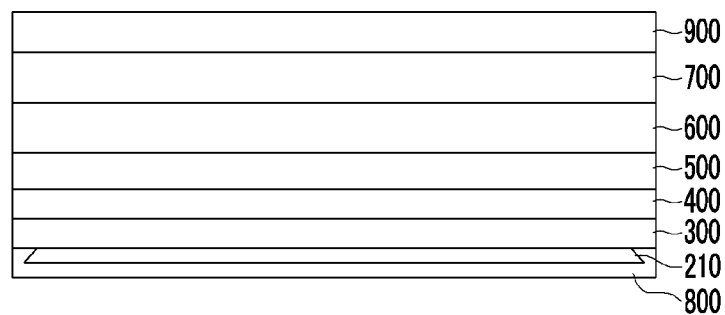

Next, as shown in FIG. 8, a first protection film 800 is attached to a lower side of the reduction layer 210, and a second protection film 900 is attached to an upper side of the light-emitting device 600 (S600).

The flexible display device is manufactured by attaching the first protection film 800 to a back surface of the reduction layer 210, which is positioned at the lower side of the reduction layer 210, and attaching the second protection film 900 to a front surface of the sealing portion 700, which is positioned at the upper side of the light-emitting device 600. Each of the first protection film 800 and the second protection film 900 comprises an organic material such as polyethylene terephthalate, a polyimide, a polycarbonate, an epoxy, a polyethylene, and a polyacrylate, and may be flexible, stretchable, foldable, bendable, or rollable.

As described above, according to the manufacturing method of the flexible organic light emitting device of the example embodiment, it is possible to easily separate the substrate 400 from the support substrate 100 by forming the barrier layer 300 containing the hydrogen on the release layer 200 and then performing the heat treatment for reducing the release layer 200 to form the reduction layer 210. Since no additional process or external force except for the heat treatment is required in the separating process, it is possible to prevent the light-emitting device 600 and the thin film transistor portion 500 from being damaged. Further, since the substrate 400 may be separated by only the heat treatment, it is possible to simplify the manufacturing process compared to a conventional method using a laser, etc.

A flexible display device according to another example embodiment will now be described with reference to FIGS. 9 and 10. Hereinafter, as the flexible display device according to another example embodiment, a flexible organic light emitting device, a light-emitting device of which is an organic light emitting element, will be described with examples, but it is not limited thereto.

Figure 9:
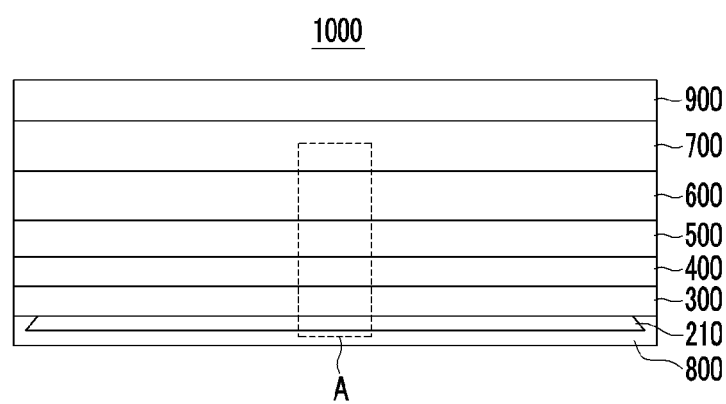
FIG. 9 illustrates a cross-sectional view of a flexible display device according to another example embodiment.

FIG. 9 illustrates a cross-sectional view of a flexible display device according to another example embodiment. FIG. 10 illustrates a detailed cross-sectional view of a portion "A" of FIG. 9.

Figure 10:
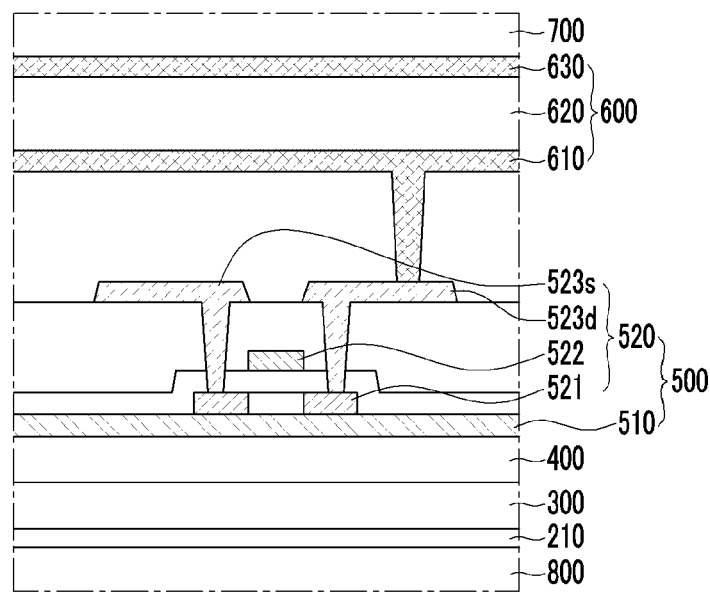
FIG. 10 illustrates a detailed cross-sectional view of a portion "A" of FIG. 9.

As shown in FIGS. 9 and 10, a flexible display device 1000 according to another example embodiment comprises a reduction layer 210, a barrier layer 300, a substrate 400, a thin film transistor portion 500, a light-emitting device 600, a sealing portion 700, a first protection film 800, and a second protection film 900.

The reduction layer 210 may include a metal or a metal oxide. The reduction layer 210 comprises at least one of molybdenum dioxide ($MoO_2$), manganese oxide (MnO), and manganese (Mn).

The barrier layer 300 is disposed on the reduction layer 210. The barrier layer 300, which contains hydrogen, may include at least one of silicon (Si), a silicon oxide ($SiO_x$), a silicon nitride ($SiN_x$), and a silicon oxynitride (SiON) together with the hydrogen. The barrier layer 300 serves as a reducer that supplies the hydrogen to form the reduction layer 210 in the manufacturing process of the flexible display device.

The substrate 400 may be formed as an organic layer or an inorganic layer. For example, the substrate 400 may include a polyimide, a perylene, aluminum oxide ($Al_2O_3$), or silicon dioxide ($SiO_2$), but is not limited thereto. The substrate 400 has a smaller CTE than the reduction layer 210.

The thin film transistor portion 500 is disposed on the substrate 400, and may include a thin film transistor 520 and a buffer layer 510 formed between the thin film transistor 520 and the substrate 400.

The buffer layer 510 may be formed as a single layer or multi-layers including an inorganic material such as a silicon oxide or a silicon nitride.

The thin film transistor 520 is disposed between the buffer layer 510 and the light-emitting device 600, and is connected to the light-emitting device 600. For convenience of illustration, only one thin film transistor 520 is shown, but the present embodiments are not limited thereto, and the thin film transistor 520 may be connected to at least one scanning wire, at least one data wire, a plurality of thin film transistors, and at least one capacitor, which may have various known structures to be connected to the thin film transistor 520.

The thin film transistor 520 comprises an active layer 521, a gate electrode 522, a source electrode 523$s$, and a drain electrode 523$d$.

The active layer 521 is disposed on the buffer layer 510, and may comprise a polysilicon or oxide semiconductor. The oxide semiconductor may include one of the oxides based on titanium (Ti), hafnium (Hf), zirconium (Zr), aluminum (Al), tantalum (Ta), germanium (Ge), zinc (Zn), gallium (Ga), tin (Sn), or indium (In), and complex oxides thereof such as zinc oxide (ZnO), indium-gallium-zinc oxide (InGaZnO4), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O).

The active layer 521 comprises a channel area that is not doped with impurities, and a source area and a drain area that are formed on opposite sides of the channel area by being doped with impurities. Herein, these impurities may be varied according to types of the thin film transistor, and may include n-type or p-type impurities. When the active layer 521 comprises an oxide semiconductor, an additional passivation layer may be disposed to protect the oxide semiconductor which is vulnerable to an external environment such as high-temperature exposure.

The gate electrode 522 is disposed on the active layer 521, and each of the source electrode 523$s$ and the drain electrode 523$d$ is disposed on the gate electrode 522 to be connected to the source region and the drain region of the active layer 521 through a contact hole.

In order to prevent a short-circuit between the active layer 521, the gate electrode 522, the source electrode 523$s$, and the drain electrode 523$d$ which form the thin film transistor 520, at least one insulating layer is disposed therebetween. Such an insulating layer may include an inorganic material such as a silicon nitride or a silicon oxide, for example, the insulating layer may include at least one of $SiN_x$, $Al_2O_3$, $SiO_2$, and $TiO_2$.

The drain electrode 523$d$ of the thin film transistor 520 is connected to the light-emitting device 600.

The light-emitting device 600 comprises a first electrode 610 connected to the drain electrode 523$d$ of the thin film transistor 520, an organic emission layer 620 disposed on the first electrode 610, and a second electrode 630 disposed on the organic emission layer 620.

The first electrode 610 may be an anode, which is a hole injection electrode, and may be at least one of a light reflective electrode, a light semi-transmissive electrode, and a light transmissive electrode. In a further example embodiment, the first electrode 610 may be a cathode, which is an electron injection electrode.

The organic emission layer 620 is disposed on the first electrode 610. The organic emission layer 620 may be made of a low molecular weight organic material or a high molecular weight organic material such as PEDOT (poly(3, 4-ethylenedioxythiophene)), or the like. The organic emission layer 620 may include a red organic emission layer that emits red light, a green organic emission layer that emits green light, and a blue organic emission layer that emits blue light, and the red organic emission layer, the green organic emission layer, and the blue organic emission layer are respectively formed in a red pixel, a green pixel, and a blue pixel to implement a color image. The organic emission layer 620 may implement the color image by stacking all of the red organic emission layer, the green organic emission layer, and the blue organic emission layer together in each of the red pixel, the green pixel, and the blue pixel, and forming a red color filter, a green color filter, and a blue color filter for each pixel. As another example, the color image may be implemented by forming a white organic emission layer as the organic emission layer 620 that emits white light in all of the red pixel, the green pixel, and the blue pixel, and forming the red color filter, the green color filter, and the blue color filter for each pixel. In the case that the color image is implemented by the white organic emission layer as the organic emission layer 620 and the color filter, a deposition mask for depositing the red organic emission layer, the green organic emission layer, and the blue organic emission layer on each pixel, e.g., the red pixel, the green pixel, and the blue pixel, is not required. The white organic emission layer as the organic emission layer 620 that is described in another example may comprise one organic emission layer, and comprises a configuration in which a plurality of organic emission layers are stacked to emit white light. For example, the organic emission layer 620 may have configurations in which at least one yellow organic emission layer and at least one blue organic emission layer are combined to emit white light, at least one cyan organic emission layer and at least one red organic emission layer are combined to emit white light, at least one magenta organic emission layer and at least one green organic emission layer are combined to emit white light, and the like.

The second electrode 630 is disposed on the organic emission layer 620, and may be a cathode, which is an electron injection electrode. The second electrode 630 may be at least one of a light reflective electrode, a light semi-transmissive electrode, and a light transmissive electrode. The second electrode 630 may be provided throughout the substrate 400 to cover the organic emission layer 620. In another example embodiment, the second electrode 630 may be a hole injection electrode.

The sealing portion 700 is disposed on the substrate 400 with the buffer layer 510, the thin film transistor 520, and the light-emitting device 600 therebetween. The sealing portion 700 is disposed throughout the substrate 400, and seals the thin film transistor portion 500 and the light-emitting device 600 together with the substrate 400. The sealing portion 700 may be formed as a thin film encapsulation portion or an encapsulation substrate. When the sealing portion 700 is formed as the thin film encapsulation portion, the sealing portion 700 may include an organic layer and an inorganic layer disposed on the organic layer. For example, the sealing portion 700 may include at least one organic layer and at least one inorganic layer which are alternately stacked, and the inorganic layer and the organic layer may respectively include a plurality of inorganic layers and a plurality of organic layers, and the inorganic layers and the organic layers may respectively be alternately stacked. The sealing portion 700 may include at least one sandwich structure in which at least one organic layer is inserted between at least two inorganic layers. An inorganic layer, which is the uppermost layer of the sealing portion 700, is layered with a wider area compared to the organic layer so as to cover ends of the organic layer which is another layer. The organic layer of the sealing portion 700 is made of a polymer, and may preferably be a single layer or a stacked layer comprising any one of, for example, polyethylene terephthalate, a polyimide, a polycarbonate, an epoxy, a polyethylene, and a polyacrylate. For example, the organic layer may comprise a polyacrylate, and in further detail, the organic layer comprises a material produced by polymerizing a monomer component including a diacrylate-based monomer and a triacrylate-based monomer. Herein, a monoacrylate-based monomer may be further included in the monomer component, and a photo-initiator known in the art, such as TPO, may be further included in the monomer component, but the present embodiments are not limited thereto. The inorganic layer of the sealing portion 700 may be a monolayer or a multilayer containing a metal oxide or a metal nitride. In detail, the inorganic layer may contain any one of SiNx, $Al_2O_3$, $SiO_2$, and $TiO_2$. As such, the second protection film 900 and the first protection film 800 are respectively attached to the entire upper surface of the sealing portion 700 and the rear surface of the reduction layer 210.

Each of the first protection film 800 and the second protection film 900 protects the reduction layer 210 and the sealing portion 700 from the external interference, and comprises an organic material such as a polyethylene terephthalate, a polyimide, a polycarbonate, an epoxy, a polyethylene, and a polyacrylate. Each of the first protection film 800 and the second protection film 900 may be flexible, stretchable, foldable, bendable, or rollable.

As such, in the flexible display device 1000 according to another example embodiment, since the CTE of the material contained in the substrate 400 is smaller than that of the material contained in the reduction layer 210, even though the reduction layer 210 may be deformed during the manufacturing process thereof, it is possible to prevent the deformation from being transferred to the thin film transistor portion 500 and the light-emitting device 600.

Further, the flexible display device 1000 according to another example embodiment comprises the reduction layer 210 including the metal or the metal oxide, for example, at least one of the molybdenum dioxide ($MoO_2$), the manganese oxide (MnO), and the manganese (Mn) disposed at the lower surface of the substrate 400, which has a dense configuration compared to the organic material, thereby preventing external moisture from permeating the thin film transistor portion 500 or the light-emitting device 600 through the substrate 400. Accordingly, the lifespan of the thin film transistor portion 500 and the light-emitting device 600 is improved, thus the total lifespan of the flexible display device 1000 may increase.

While this disclosure has been described in connection with what is presently considered to be practical example embodiments, it is to be understood that the embodiments are not limited to the disclosed embodiments, but, on the contrary, is intended to cover various modifications and equivalent arrangements included within the spirit and scope of the appended claims.

What is claimed is:

1. A manufacturing method for a flexible display device, comprising:
   forming a release layer on a support substrate;
   forming a barrier layer on the release layer;
   forming a substrate and a light-emitting device on the barrier layer;
   forming a reduction layer by reducing a portion of the release layer adjacent to the barrier layer by performing a first heat treatment;
   separating the substrate from the support substrate by separating an interface between the release layer and the reduction layer; and
   wherein the release layer comprises a metal oxide.

2. The manufacturing method for the flexible display device of claim 1, wherein the first heat treatment is performed at about from 400° C. to about 500° C. for from about 0.5 to about 4 h.

3. The manufacturing method for the flexible display device of claim 1, wherein the reduction layer has a smaller coefficient of thermal expansion (CTE) than the release layer.

4. The manufacturing method for the flexible display device of claim 1, wherein the release layer has a thickness of from about 500 Å to about 2000 Å.

5. The manufacturing method for the flexible display device of claim 1, wherein the release layer comprises at least one of molybdenum trioxide $MoO_3$ and manganese dioxide ($MnO_2$).

6. The manufacturing method for the flexible display device of claim 5, wherein the forming of the release layer comprises depositing molybdenum (Mo) or manganese (Mn) by sputtering and then performing a second heat treatment for the deposited molybdenum (Mo) or manganese (Mn) in an air atmosphere including oxygen.

7. The manufacturing method for the flexible display device of claim 6, wherein the second heat treatment is performed at from about 400° C. to about 450° C.

8. The manufacturing method for the flexible display device of claim 1, wherein the barrier layer comprises hydrogen.

9. The manufacturing method for the flexible display device of claim 7, wherein some of the release layer is reduced by the hydrogen included in the barrier layer.

10. The manufacturing method for the flexible display device of claim 7, wherein the forming of the barrier layer comprises depositing at least one of silicon (Si), silicon oxide (SiOx), silicon nitride (SiNx), and silicon oxynitride (SiON) while supplying hydrogen gas as one of reaction gasses.

* * * * *